United States Patent
Lattimore et al.

[11] Patent Number: 5,982,692
[45] Date of Patent: Nov. 9, 1999

[54] BIT LINE BOOST AMPLIFIER

[75] Inventors: George McNeil Lattimore, Austin; Robert Anthony Ross, Jr., Cedar Park; Gus Wai-Yen Yeung, Austin, all of Tex.

[73] Assignee: International Business Machines Corporation, Armonk, N.Y.

[21] Appl. No.: 08/905,000

[22] Filed: Aug. 1, 1997

[51] Int. Cl.[6] .................................................. G11C 7/02
[52] U.S. Cl. ............................. 365/208; 365/205; 327/57
[58] Field of Search ................................... 365/208, 205, 365/207; 327/51, 57

[56] References Cited

U.S. PATENT DOCUMENTS 5,526,314  6/1996  Kumar ..................................... 365/207
5,663,905  9/1997  Matsuo et al. ........................... 365/149

Primary Examiner—David Nelms
Assistant Examiner—Hoai V. Ho
Attorney, Agent, or Firm—Robert V. Wilder; Anthony V.S. England

[57] ABSTRACT

A method and apparatus is provided for implementing a memory cell array having a performance-improved critical read path using a boost amplifier configuration. The memory bit line is broken into small segments with a boost amplifier and the bit line is connected to the input of the amplifier. The output of the amplifier drives the global bit line. The amplifier is turned "on" during a "read" and turned "off" during a "write". During a read, one memory cell within one array segment is turned on. The memory cell drives the differential signal on to the local bit line pair. Also during a read, the boost amplifier which attaches to that local bit line is enabled. The boost amplifier amplifies the input signal (local bit line pair) and drives that signal on to the global bit line. Since the bit line is broken into small segments with boost amplifiers, there are many boost amplifiers attached on the global bit line. When enough signal is developed on the global bit line pair, the global sense amplifier is turned on. The bit line is thus quickly pulled to ground thereby significantly improving performance for the critical read path.

20 Claims, 3 Drawing Sheets

BIT LINE BOOST AMPLIFIER

RELATED APPLICATIONS

The present application is related to a co-pending application entitled "METHOD and APPARATUS FOR MEMORY CELL ARRAY BOOSTS AMPLIFIER", Ser. No. 08/904,987, filed on Aug. 1, 1997 and assigned to the assignee of the present application.

FIELD OF THE INVENTION

The present invention relates generally to digital logic signal processing and more particularly to a boost amplifier circuit for use in memory circuits.

BACKGROUND OF THE INVENTION

In traditional differential signal memory arrays utilizing the standard six device cell, four transistors are configured to form a cross-coupled latch/memory cell for storing data and two transistors are used to obtain access to the memory cell. During a "read" access, differential data stored within the memory cell is transferred to an attached bit line pair. Differential voltage is allowed to develop on the bit lines until sufficient offset between bit lines (100–200 mv) has developed to reliably sense the binary state of the memory cell. With the completion of the read, the differential bit line pairs are clamped together and restored high (to a "high" logic level voltage or "VDD") to cancel the offset generated during the read operation.

During a "write" access, data is written into the cell through the differential bit line pair. In general, one side of the bit line pair is driven low (i.e. to a low logic level potential or ground) and the other side of the differential pair is driven high to VDD minus the threshold voltage of the transistor Vt. Following the write, the differential bit line pair must be restored to VDD prior to the next read/write access to the memory cell. For a traditional memory array, the time required for a sufficient bit line offset development to reliably read the memory cell in addition to the time required to restore one-half of the differential bit line pair ground potential to VDD after a write operation defines the minimum cycle time for the array.

Improvements to either the bit line offset development rate, or the bit line restore time following a write, will increase performance of the memory structure as a whole. For a large array, it is more efficient if the array is organized in long column bit lines, i.e. many rows. However, the length of an array bit line is limited by the signal development time for a read. For an array with a long bit line, the signal development time is therefore the most critical path.

Thus there is a need to provide an improved method and apparatus for the implementation of a boost amplifier circuit which is effective to boost the performance of a critical read path in memory cell arrays having extensive bit line layouts.

SUMMARY OF THE INVENTION

A method and apparatus is provided for implementing a memory cell array having a performance-improved critical read path using a boost amplifier configuration. The memory bit line is broken into small segments with a boost amplifier and the bit line is connected to the input of the amplifier. The output of the amplifier drives the global bit line. The amplifier is turned "on" during a "read" and turned "off" during a "write". During a read, one memory cell within one array segment is turned on. The memory cell drives the differential signal on to the local bit line pair. Also during a read, the boost amplifier which attaches to that local bit line is enabled. The boost amplifier amplifies the input signal (local bit line pair) and drives that signal on to the global bit line. When enough signal is developed on the global bit line pair, the global sense amplifier is turned on. The bit line is thus quickly pulled to ground thereby significantly improving performance for the critical read path.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Although the present disclosure shows isolated circuitry for the sake of simplicity, it is understood that the present invention is not limited to isolated logic implementations or logic array implementations but rather also includes systems in which the methodology taught herein is implemented within or as part of a single system CPU or other larger semiconductor system, chip, processor or integrated circuit. Also, in the present example, the terms "source" or "source potential" or "VDD" are used interchangeably to refer to a logic "1" or "high" level potential. Also the terms "zero level", "ground potential", or "ground" are also used interchangeably to refer to a logic "0" or "low" level potential.

Figure 1:
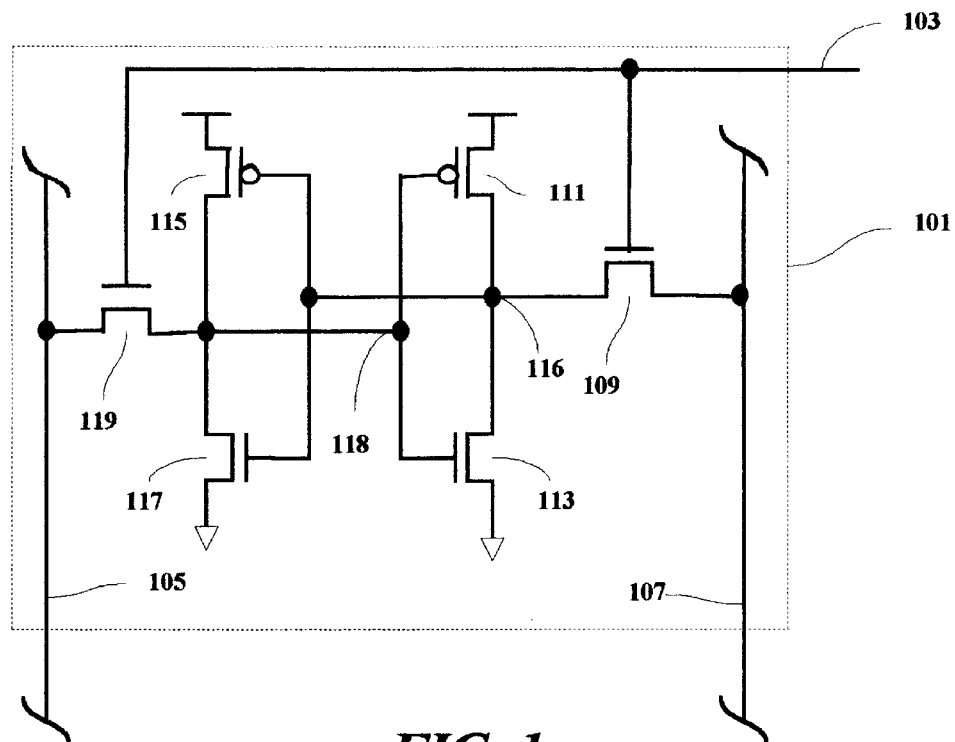
FIG. 1 is a circuit diagram of a typical six transistor single port memory cell.

With reference to FIG. 1, there is shown a typical prior art six transistor memory cell 101 including a read/write line 103 and output bit lines 105 and 107. Line 103 is connected to a gate terminal of an n-channel transistor 109. Transistor 109 is connected between output bit line 107 and a common point 116 between the output terminals of a p-channel transistor 111 and an n-channel transistor 113. Transistors 111 and 113 are connected between a high logic level and a ground potential in the present example. The common point 116 is also connected to the gate terminals of a p-channel transistor 115 and an n-channel transistor 117. Transistors 115 and 117 are connected between a high logic level and a ground potential in the present example. A second common point 118 between the output terminals of transistors 115 and 117 is connected to the gate terminals of transistors 111 and 113. The common point 118 is also connected through an n-channel transistor 119 to the bit line 105. Transistor 119 has its gate terminal connected to the line 103. As hereinbefore described, transistors 111, 113, 115 and 117 are used to form a cross-coupled latch memory cell for storing data and transistors 109 and 119 are used to obtain access to the memory cell. During a read access, for example, differential data stored within this memory cell is transferred to the attached bit line pair 105 and 107 in a conventional and well known manner.

Figure 2:
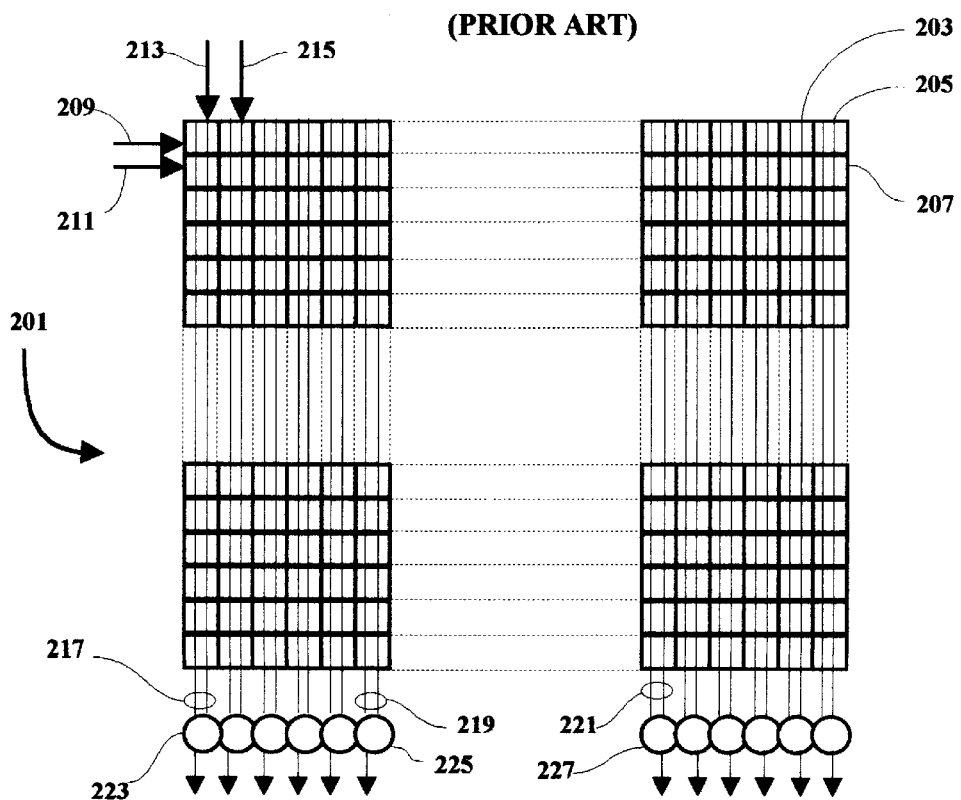
FIG. 2 is a schematic diagram of a typical large array memory cell configuration.

FIG. 2 illustrates a typical prior art memory cell configuration 201 comprised of individual cells such as cells 203, 205 and 207, connected together in rows (such as rows 209 and 211) and columns (such as columns 213 and 215). As illustrated, bit line pairs, such as bit line pairs 217, 219 and 221, are connected through long column bit lines to corresponding sense amplifiers such as amplifiers 223, 225 and 227. The performance of the prior art configuration illustrated in FIG. 2 is limited by the signal development time for the relatively long column bit lines.

Figure 3:
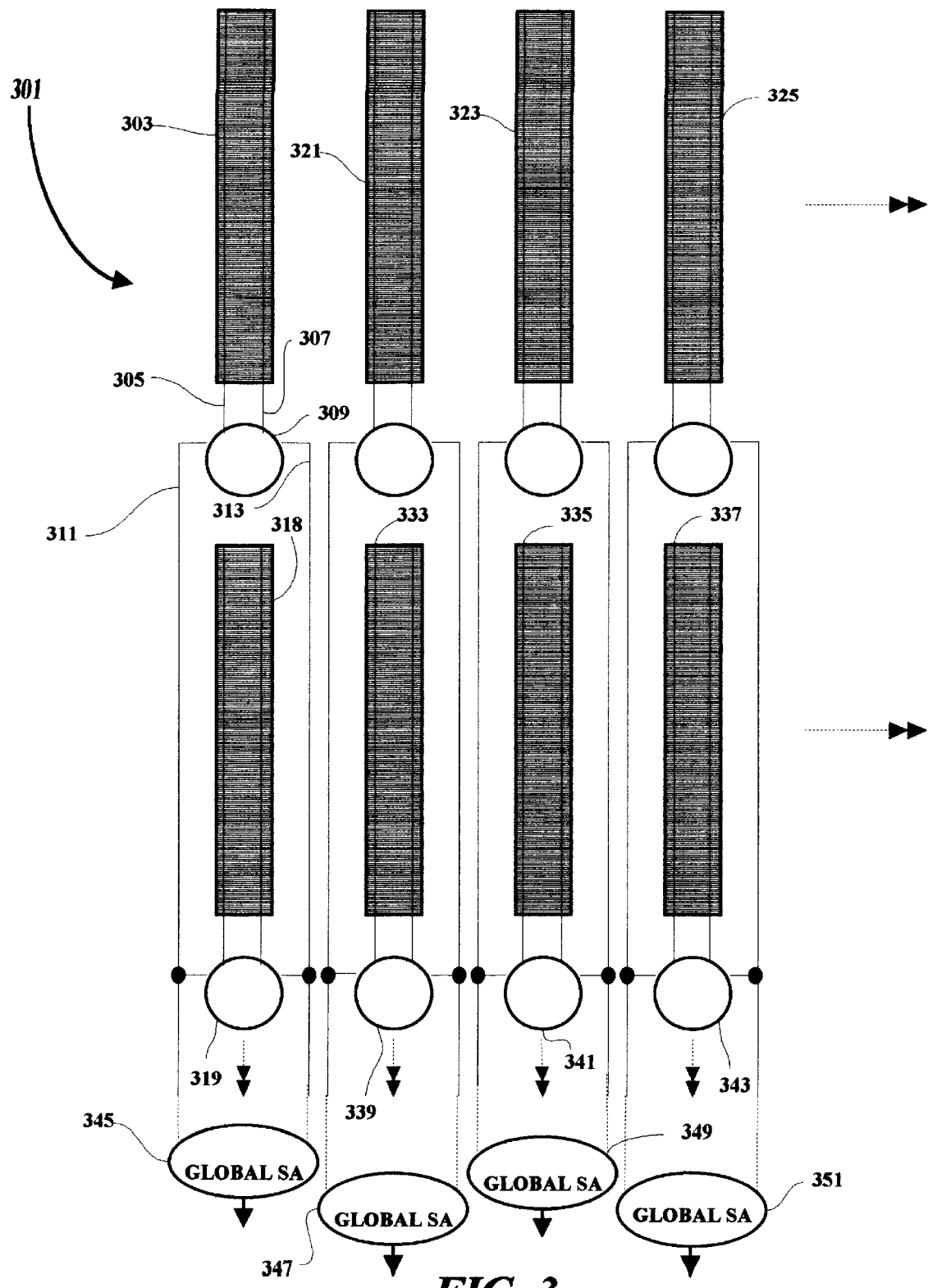
FIG. 3 is a schematic diagram of a large array memory cell configuration including an exemplary embodiment of a boost amplifier implementation in accordance with the present invention.

FIG. 3 illustrates a memory cell array configuration 301 having a boost amplifier implementation in accordance with the present invention. In the example, columns or groups of memory cells, such as columns 303, 321 323 and 325, are arranged in an array configuration. Each group of memory cells has a pair of "local" bit lines such as bit lines 305 and 307 connected to each cell and through the column or group to a corresponding booster amplifier such as amplifier 309. A second row of memory cell groups or columns such as columns 318, 333, 335 and 337 is shown with each group connected to a corresponding booster amplifier such as amplifiers 319, 339, 341 and 343, respectively. All of the booster amplifiers are also connected to corresponding pairs of "global" bit line pairs such as bit lines 311 and 313. Each pair of global bit lines such as 311 and 313 is connected to a corresponding group global sensing amplifier, such as amplifiers 345, 347, 349 and 351. The rows and columns are arranged in an array configuration and are extended as illustrated in order to implement various circuit memory requirements.

Figure 4:
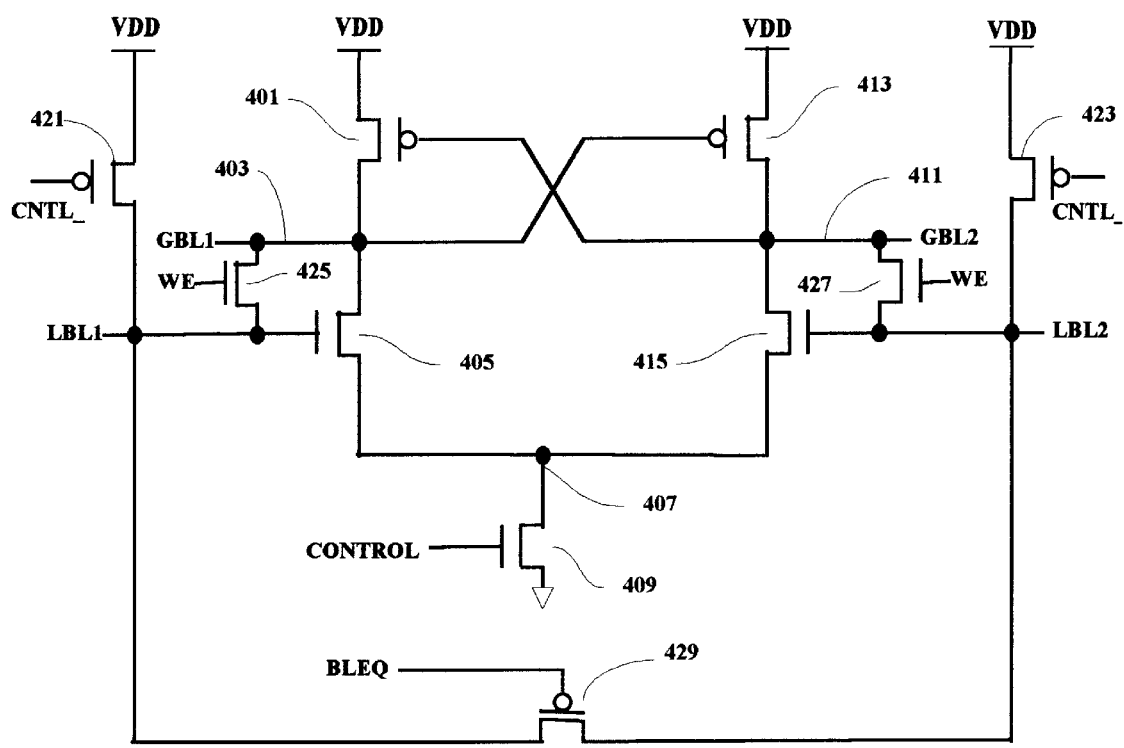
FIG. 4 is a circuit diagram of an exemplary embodiment of a boost amplifier memory cell configuration in accordance with the present invention.

In FIG. 4, an exemplary memory cell with a boost amplifier circuit is illustrated. A PMOS transistor is connected between VDD and a first global bit line GBL1 403, which is, in turn, connected through two series connected NMOS transistors 405 and 409 to ground. The gate terminal of transistor 409 is arranged to receive an ENABLE signal. The gate terminal of transistor 405 is connected to a first local bit line LBL1. Another PMOS transistor 413 connects a second global bit line GBL2 411 to VDD. The gate terminal of transistor 401 is connected to the second global bit line GBL2 411 and the gate terminal of transistor 413 is connected to the first global bit line GBL1 403. The second global bit line GBL2 411 is also connected through an NMOS transistor 415 to a common point 407 between transistors 405 and 409. PMOS transistor 421 acts as a pull-up transistor and connects local bit line LBL1 to VDD. Similarly, PMOS transistor 423 connects the second bit line LBL2 to VDD. NMOS transistors 425 and 427 connect the first local bit line LBL1 with the first global bit line GBL1, and the second local bit line LBL2 with the second global bit line GBL2, respectively. The gate terminals of transistors 425 and 427 are arranged for connection to a write enable signal WE. PMOS transistor 429 connects the local bit lines LBL1 and LBL2. The PMOS transistor or equalizer device 429 is arranged to be activated by a bit line equalizer signal BLEQ to selectively connect the local bit lines LBL1 and LBL2 together to equalize the local bit lines during idle states when neither a read operation not a write operation is active.

In operation, the gate terminals of PMOS transistors 421 and 423 are connected to "control_" and are used to restore the local bit line LBL1 and LBL2, respectively, to VDD when a local bit line is not accessed. NMOS 425 and 427 gates are turned "on" if "write" is enabled, i.e. if WE is at a logic "1" or a high level. The boost amplifier portion of the circuit includes PMOS transistors 401 and 413, and NMOS transistors 405, 415 and 409. PMOS transistors 401 and 413 are commonly referred to as a cross-coupled latch. The gates of NMOS transistors 405 and 415 are connected to the local bit line pair LBL1 and LBL2, respectively, and the drains of NMOS transistors 405 and 415 are connected to the global bit line pair including GBL1 and GBL2, respectively. The gate of NMOS transistor 409 is connected to "control" (the inversion of "control_") and is used as an enable device. Transistor 409 is turned "on" during a read access. When transistor 409 is turned on, the boost amplifier is activated and amplifies input signal to output.

When the array 301 is in the idle state, the boost amplifier is turned "off". Since the "bit line" is broken into a local bit line pair and global bit line pair, separate restore devices for the two different bit line groups are required. PMOS transistors 421 and 423 are used to restore and keep the local bit line at VDD when the array is in the idle state. The signal "control_", global sense amplifier control point and "control" are at ground level when the array is not being accessed. During a "write", "control" and the global sense amplifier control point are at ground level and "control_" is at VDD level. NMOS transistors 425 and 427 are turned on by WE. They are used as transfer devices to transfer data from the global bit line onto the local bit line. The boost amplifier is turned off during a write access.

For a read access, PMOS devices 421 and 423 are turned off, as well as NMOS devices 425 and 427. NMOS 409 is immediately turned on. Since both the global and local bit line group are restored to VDD, the gates of NMOS 405 and 415 are at VDD and turned on. When NMOS 409 is turned on, conduction paths from the drains of NMOS 405 and 415 to ground are established, and they are conducting and discharging their drain nodes. The drain nodes are connected to the gates of PMOS 401 and 413 and as they are being discharged, the PMOS devices are slowly turned on. As the read access progresses, one of the bit lines is discharging to ground (the bit line pair is a "True/Complement" pair) and the other bit line is driving VDD-Vt (the transfer device within a memory cell is NMOS which cannot drive a VDD output). The gates of transistors 415 and 405 are connected to the local bit lines LBL1 and LBL2, one of the NMOS devices is becoming less and less conductive (since one of the bit lines is discharging to ground) and the drain of this NMOS is driven closer to VDD by the PMOS connected to it. At the same time, because of the cross-coupled nature of the circuit, the other half of the circuit is becoming more and more conductive and driving the output closer to ground.

After some differential signal has been developed on the global bit line pair GBL1 and GBL2, the global sense amplifier or global SA, such as 345, 347,349 and 351, are turned on. That process will quickly pull one global bit line to ground and the other global bit line to VDD.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A boost amplifier circuit comprising:

an amplifier arranged for connection to a local bit line pair of signal lines for receiving an input signal from said local bit line pair of signal lines, said local bit line pair of signal lines comprising first and second local bit lines, said amplifier being responsive to a first enable signal for amplifying said input signal and providing an amplifier output signal to a global bit line pair of signal lines, said global bit line pair of signal lines comprising first and second global bit lines;

a latch circuit connected to said amplifier, said latch circuit being selectively operable for storing said amplifier output signal; and first and second write enable devices, said first write enable device being arranged between said first local bit line and said first global bit line, said second write enable device being arranged between said second local bit line and said second global bit line, said first and second write enable devices being arranged to receive a write enable signal, said first write enable device being operable in response to said write enable signal for connecting said first local bit line with said first global bit line, said second write enable device being operable in response to said write enable signal for connecting said second local bit line to said second global bit line, whereby data is transferred from global bit lines to corresponding local bit lines during a write operation.

2. The boost amplifier circuit as set forth in claim 1 wherein said first enable signal is a read enable signal, said read enable signal being selectively generated to initiate a read cycle to read said amplifier output signal.

3. The boost amplifier circuit as set forth in claim 2 and further including:

a local bit line equalizer device connected between said first and second local bit lines of said local bit line pair, said local bit line equalizer device being selectively operable for equalizing potential levels between said first and second local bit lines.

4. The boost amplifier circuit as set forth in claim 3 wherein said local bit line equalizer device is operable to equalize potential levels between said first and second local bit lines during idle states of the boost amplifier circuit.

5. The boost amplifier circuit as set forth in claim 4 and further including:

first and second pull-up devices connecting said first and second local bit lines to a predetermined default potential during idle states of said boost amplifier circuit.

6. The boost amplifier as circuit set forth in claim 5 wherein said latch circuit comprises a cross-coupled latch memory cell.

7. The boost amplifier circuit as set forth in claim 6 wherein said latch circuit further comprises first and second cross-coupled MOS transistor devices.

8. The boost amplifier circuit as set forth in claim 7 wherein said first and second cross-coupled MOS transistor devices are PMOS transistors.

9. The boost amplifier circuit as set forth in claim 1 wherein said boost amplifier circuit is included within one integrated circuit.

10. A circuit configuration comprising:

a first group of memory cells arranged in a first array;

first and second local bit lines of said first group, said first and second local bit lines of said first group being connected to each memory cell of said first group, said first and second local bit lines of said first group being arranged to provide a first group output signal;

a global bit line pair of signal lines including first and second global bit lines;

a first boost amplifier circuit arranged to receive said first group output signal and provide a first group global signal for application to said global bit line pair;

a second group of memory cells arranged in a second array;

first and second local bit lines of said second group, said first and second local bit lines of said second group being connected to each memory cell of said second group, said first and second local bit lines of said second group being arranged to provide a second group output signal;

a second boost amplifier circuit arranged to receive said second group output signal and provide a second group global signal for application to said global bit line pair; and a global sense amplifier circuit arranged to receive inputs from said global bit line pair and provide an output signal from said circuit configuration, said circuit configuration further including a write enable device connected between corresponding bit lines of said local bit line pair and said global bit line pair of signal lines, said write enable device being arranged to receive a write enable signal, said write enable device being further selectively operable in response to said write enable signal for connecting corresponding bit lines of said local bit line pair and said global bit line pair, whereby data is transferred from global bit lines to corresponding local bit lines during a write operation.

11. The circuit configuration as set forth in claim 10 wherein said first boost amplifier circuit comprises:

an amplifier arranged for connection to a local bit line pair of signal lines for receiving an input signal from said local bit line pair of signal lines, said amplifier being responsive to a first enable signal for amplifying said input signal and providing an amplifier output signal to a global bit line pair of signal lines; and a latch circuit connected to said amplifier, said latch circuit being selectively operable for storing said amplifier output signal, said booster amplifier circuit including means responsive to said write enable signal for disabling said amplifier when said write enable signal is received.

12. The circuit configuration as set forth in claim 11 wherein said first enable signal is a read enable signal, said read enable signal being selectively generated to initiate a read cycle to read said amplifier output signal.

13. The circuit configuration as set forth in claim 12 and further including:

a local bit line equalizer device connected between first and second local bit lines of said local bit line pair, said local bit line equalizer device being selectively operable for equalizing potential levels between said first and second local bit lines.

14. The circuit configuration as set forth in claim 13 wherein said local bit line equalizer device is operable to equalize potential levels between said first and second local bit lines during idle states of the boost amplifier circuit.

15. The circuit configuration as set forth in claim 14 and further including:

first and second pull-up devices connecting said first and second local bit lines to a predetermined default potential during idle states of said boost amplifier circuit.

16. The boost amplifier as circuit set forth in claim 15 wherein said latch comprises a cross-coupled latch memory cell.

17. The circuit configuration as set forth in claim 16 wherein said latch further comprises first and second cross-coupled MOS transistor devices.

18. The circuit configuration as set forth in claim 17 wherein said first and second cross-coupled MOS transistor devices are PMOS transistors.

19. The circuit configuration as set forth in claim 10 wherein said circuit configuration is included within one integrated circuit.

20. A method of configuring a plurality of memory cells in a memory circuit, said method comprising:
   dividing the plurality of memory cells into groups of memory cells;
   connecting local bit line pairs to each group of memory cells;
   applying the bit line pairs to inputs of corresponding boost amplifiers;
   providing a global bit line pair;
   connecting outputs from said boost amplifiers to said global bit line pair;
   connecting said global bit line pair as inputs to a global sense amplifier, said global sense amplifier being selectively operable for providing an output signal from said memory circuit; and
   connecting local bit lines to corresponding ones of said global bit lines during memory cell write operations.

* * * * *